United States Patent
Aisa

(10) Patent No.: US 10,527,660 B2
(45) Date of Patent: Jan. 7, 2020

(54) METHOD, CONTROLLER AND SYSTEM FOR DETECTING A LEAKAGE OF A TRACK SIGNAL ON AT LEAST ONE RAILWAY TRACK

(71) Applicant: ALSTOM TRANSPORT TECHNOLOGIES, Saint-Ouen (FR)

(72) Inventor: Pier-Alessandro Aisa, Bologne (IT)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 13 days.

(21) Appl. No.: 15/278,451

(22) Filed: Sep. 28, 2016

(65) Prior Publication Data

US 2017/0089964 A1    Mar. 30, 2017

(30) Foreign Application Priority Data

Sep. 30, 2015    (EP) ..................................... 15306548

(51) Int. Cl.
*G01R 27/02*        (2006.01)
*B61L 3/18*         (2006.01)
(Continued)

(52) U.S. Cl.
CPC ............... *G01R 27/02* (2013.01); *B61L 3/18* (2013.01); *B61L 25/025* (2013.01);
(Continued)

(58) Field of Classification Search
CPC .. G01R 31/024; G01R 31/025; G01R 31/026; B61L 27/0055; B61L 1/188; B61L 23/04; B61L 23/044; B61L 23/045
See application file for complete search history.

(56) References Cited

U.S. PATENT DOCUMENTS 3,551,889 A * 12/1970 Miller ..................... H04L 7/065
                                                        340/12.11
3,593,022 A *  7/1971 Hoyler ..................... B61L 3/221
                                                        246/34 R
(Continued)

FOREIGN PATENT DOCUMENTS

DE         31 44 841 A1     5/1983
JP        2001 213314 A     8/2001
(Continued)

OTHER PUBLICATIONS

EP Search Report, dated Mar. 9, 2016, from corresponding EP application.

*Primary Examiner* — Walter L Lindsay, Jr.
*Assistant Examiner* — Milton Gonzalez
(74) *Attorney, Agent, or Firm* — Young & Thompson

(57) ABSTRACT

According to another aspect a system is provided for detecting a track signal leakage of a track signal on at least one railway track, a track signal being a signal transmitted via the rails of a railway track to detect the presence of a railway vehicle and/or transmit a provide information to a railway vehicle, the at least one railway track comprising at least two adjacent track sections being isolated against each other, the system comprising: a controller according to an embodiment disclosed herein; at least one transmitter for emitting a test signal via a first track section, the at least one transmitter being connected to the controller; and a plurality of receivers for receiving the test signal via one or more track sections, wherein each receiver is associated to at least one track section.

14 Claims, 2 Drawing Sheets

(51) Int. Cl.
*B61L 25/02* (2006.01)
*B61L 27/00* (2006.01)
*G01V 3/02* (2006.01)

(52) U.S. Cl.
CPC ....... *B61L 27/0055* (2013.01); *B61L 27/0077* (2013.01); *B61L 27/0083* (2013.01); *G01V 3/02* (2013.01)

(56) References Cited

U.S. PATENT DOCUMENTS

| | | | | |
|---|---|---|---|---|
| 4,619,425 | A * | 10/1986 | Nagel | B61L 21/06 246/167 R |
| 6,102,340 | A * | 8/2000 | Peek | B61L 23/044 246/121 |
| 6,779,761 | B2 * | 8/2004 | Holgate | B61L 23/044 246/122 R |
| 2014/0138493 | A1 * | 5/2014 | Noffsinger | B61L 23/044 246/121 |
| 2016/0252563 | A1 * | 9/2016 | Church | G01R 31/1227 324/551 |

FOREIGN PATENT DOCUMENTS

| | | | |
|---|---|---|---|
| JP | 2001 328533 | A | 11/2001 |
| JP | 2002 337686 | A | 11/2002 |
| JP | 2004/243808 | A | 9/2004 |
| JP | 2009 113671 | A | 5/2009 |
| NO | 2015/011529 | A1 | 1/2015 |

* cited by examiner

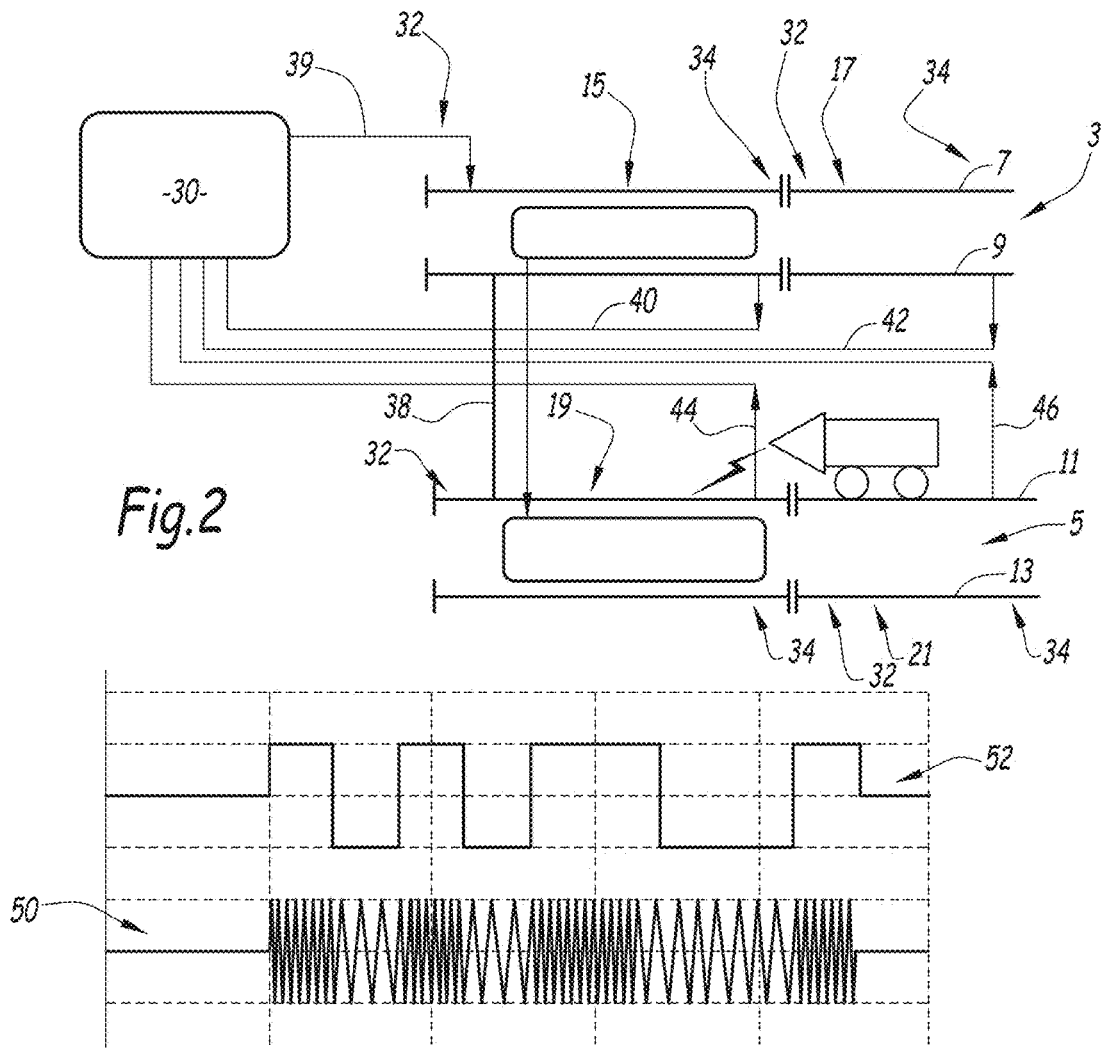
Fig.2
Fig.3
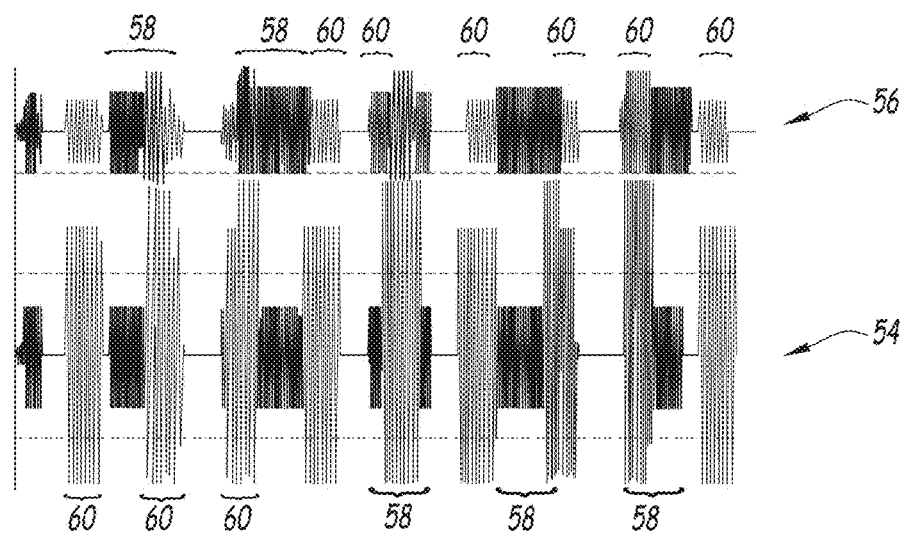
Fig.4

METHOD, CONTROLLER AND SYSTEM FOR DETECTING A LEAKAGE OF A TRACK SIGNAL ON AT LEAST ONE RAILWAY TRACK

FIELD OF THE INVENTION

The present invention concerns a method for detecting a leakage of a track signal on at least one railway track.

Further, the present invention relates to a controller for detecting a track signal leakage of a track signal on at least one railway track.

Finally, the present invention relates to a system for detecting a track signal leakage of a track signal on at least one railway track.

BACKGROUND OF THE INVENTION

In some systems, a track signal is provided to detect the presence of a railway vehicle and to transmit information to a railway vehicle. The track signal is transmitted by the rails of the railway track to the railway vehicle. However, in some cases a leakage occurs and the signal is transmitted to rails of another track. Thus, the information may be transmitted to another railway vehicle, which was not intended to receive this information. Systems have been provided to detect such a failure by measuring whether all current transmitted by a track circuit transmitter remains in the track circuit. For example, if the current is substantially reduced, the system detects that a leakage has occurred.

Object of the invention is to provide an improved method and system to detect a fault when transmitting a track signal.

SUMMARY OF THE INVENTION

According to an aspect, the method for detecting a leakage of a track signal on at least one railway track, a track signal being a signal transmitted via the rails of a railway track to detect the presence of a railway vehicle and/or to transmit information to a railway vehicle, the at least one railway track comprising at least two track sections being electrically isolated against each other, wherein at least one receiver is associated to each track section, the method comprising:
transmitting a test signal via a first track section;
activating one or more receivers associated to the plurality of track sections, wherein the plurality of receivers are adapted to receive the test signal; receiving the test signal via one or more track sections; determining the one or more track sections, where the test signal has been received; determining whether a leakage between a first track section and at least one second track section exists.

Further embodiments may include the following features, which may be combined in any technical feasible combination:
the at least two adjacent sections being on the same track or on tracks, which are side by side;
the test signal is injected on a first end of the first track section and received at the second end, being opposite to the first end;
the test signal is coded and/or includes a signature;
the test signal is modulated and/or added onto the track signal;
the modulation frequency of the test signal is greater than the modulation frequency of the track signal;
the modulation frequency of the test signal is between 200 Hz and 800 Hz, in particular between 400 Hz and 600 Hz;
the modulation frequency of the track signal is between 20 Hz and 100 Hz, in particular between 30 Hz and 70 Hz;
the track signal includes a speed information for the railway vehicle;
a respective test signal is transmitted via each track section, wherein a time slot is associated to each track section, wherein the or a test signal is transmitted via the respective track section at their respective time slot; and/or
a respective test signal is transmitted via each track section, wherein the test signals transmitted via different track section are different, in particular have a different signature.

According to a further aspect, a controller is provided for detecting a track signal leakage of a track signal on at least one railway track, a track signal being a signal transmitted via the rails of a railway track to detect the presence of a railway vehicle and/or to transmit information to a railway vehicle, the at least one railway track comprising at least two adjacent track sections being electrically isolated against each other, wherein at least one receiver is associated to each track section, wherein the controller is adapted to: transmit a test signal via a first track section;
activate one or more receivers associated to the plurality of track sections, wherein the plurality of receivers are adapted to receive the test signal; receive the test signal via one or more track sections; determine the one or more sections, where the test signal has been received; determine whether a leakage between a first track section and at least one second track section exists.

Further embodiments may include the following features: the controller is adapted to transmit a track signal, in particular to modulate the test signal and the track signal.

According to another aspect a system is provided for detecting a track signal leakage of a track signal on at least one railway track, a track signal being a signal transmitted via the rails of a railway track to detect the presence of a railway vehicle and/or transmit a provide information to a railway vehicle, the at least one railway track comprising at least two adjacent track sections being isolated against each other, the system comprising: a controller according to an embodiment disclosed herein; at least one transmitter for emitting a test signal via a first track section, the at least one transmitter being connected to the controller; and a plurality of receivers for receiving the test signal via one or more track sections, wherein each receiver is associated to at least one track section.

Further embodiments may include the following features: the at least one transmitter is provided at a first end of a first track section and at least one receiver is provided at a second end of the first track section being opposite to the first end, wherein further receivers are provided and connected to the other, in particular adjacent track sections.

So that the manner in which the above recited features of the present invention can be understood in detail, a more particular description of the invention, briefly summarized above, may be read by reference to embodiments.

BRIEF DESCRIPTION OF THE DRAWINGS

The accompanying drawings relate to embodiments of the invention and are described in the following:
FIG. 2 shows schematically a system according to the invention;
FIG. 3 shows schematically a test signal according to the invention;

FIG. 4 shows schematically a test signal modulated or added onto a track signal.

DETAILED DESCRIPTION OF THE INVENTION

Figure 1:
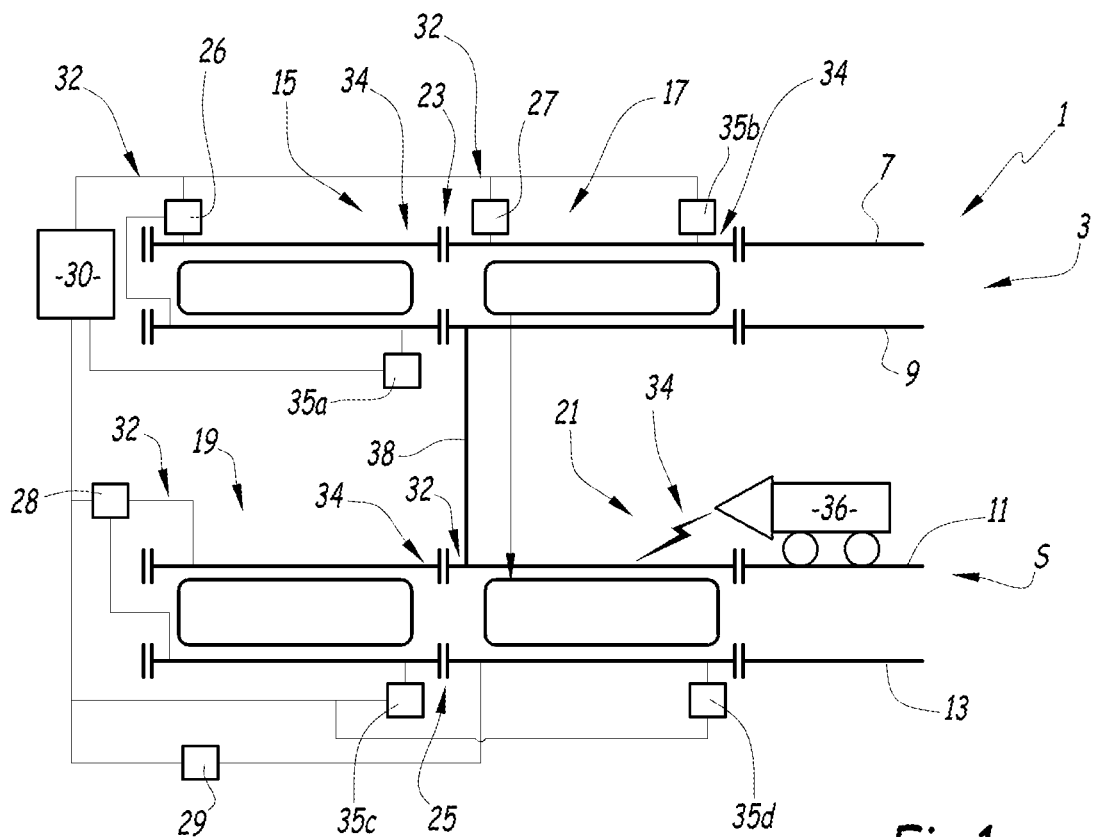
FIG. 1 shows schematically a system where a fault occurs.

FIG. 1 shows a system 1 comprising two tracks, namely a first track 3 and a second track 5. In other embodiments, the system may even comprise three or more tracks or only one track. According to an embodiment, the first track 3 and the second track 5 are side by side, in particular substantially parallel to each other. For example, the tracks 3, 5 are arranged in a train station.

The first track 3 has a first rail 7 and a second rail 9. The second track 5 has also a first rail 11 and a second rail 13.

Each track 3, 5 includes several track sections 15, 17, 19, 21. In FIG. 1 two track sections for each track 3, 5 are shown. However, each track may even comprise more or less track sections. For example the first track 3 includes a first track section 15 and a second track section 17. The second track 5 includes also a first track section 19 and a second track section 21. According to an embodiment, the system includes at least two track sections 15, 17, 19, 21 on the same track or on several tracks 3, 5.

The track sections 15 and 17 of the first track 3 are mechanically isolated against each other, for example with a mechanical insulator 23. Also the track sections 19 and 21 of the second track 5 are mechanically isolated against each other, for example with a mechanical insulator 25. Further, the first track 3 and the second track 5 are isolated against each other, for example due to a space between the tracks 3, 5.

A controller 30 is adapted to transmit a track signal via each track section 15, 17, 19, 21. For example, via each track section a different track signal is transmitted.

In an embodiment, via the first track section 15 of the first track 3 a first track signal, via the second track section 17 of the first track 3 a second track signal, via the first track section 19 of the second track 5 a third track signal, and via the second track section 21 of the second track 5 a fourth track signal is transmitted.

The track signals are typically transmitted via the two rails 7, 9, 11, 13 of each track section 15, 17, 19, 21. Accordingly, respectively at least one transmitter 26, 27, 28, 29 is associated the rails 7, 9, 11, 13 of each track section 15, 17, 19, 21. In an embodiment, the transmitter 26, 27, 28, 29 is for example provided in the controller 30. In other embodiments, the transmitter 26, 27, 28, 29 may be provided close to the respective track sections 15, 17, 19, 21, for example in a separate unit.

According to an embodiment, the track signals are induced at a first end 32 of each track section 15, 17, 19, 21. In other words, an output port of the transmitters 26, 27, 28, 29 is electrically connected to the first end 32 of each track section 15, 17, 19, 21.

Further, to each track section at least one receiver 35a to 35d is associated. In an embodiment, each receiver 35a to 35d is connected to both rails 7, 9, 11, 13 of each track section 15, 17, 19, 21. For example, the receiver may be arranged in the controller 30. In other embodiments, each receiver 35a to 35d is arranged close or adjacent to the respective track section.

In some embodiments, the receiver 35a to 35d is adapted to receive signals at a second end 34 of each track section 15, 17, 19, 21, which is opposite to the first end 32 along the track direction. An input port of the respective receivers 35a to 35d is connected to the second end 34 of the respective track section 15, 17, 19, 21. For example, the at least one receiver 35a to 35d may be adapted to receive the track signal.

Thus, according to embodiments disclosed herein, for each track section 15, 17, 19, 21, the one or more transmitters 26, 27, 28, 29 and the one or more receivers 35a to 35d are connected the opposite ends 32, 34 of the respective track section to which they are associated. In other words, the output port of one or more transmitters 26, 27, 28, 29 may be connected to the first end 32 or to the second end 34 of the respective track section 15, 17, 19, 21 and the one or more receivers to the other one of the first and second end 32, 34 of the respective track section 15, 17, 19, 21. In some embodiments, for each track section 15, 17, 19, 21 the arrangement may be different.

According to an embodiment, a track signal is transmitted via one or more track sections 15, 17, 19, 21 to determine whether a railway vehicle is present on the respective track section 15, 17, 19, 21 and/or to transmit information to the railway vehicle 36. For example, the information includes a speed information for the railway vehicle, for example the allowed speed on a specific track section 15, 17, 19, 21.

The railway vehicle 36 includes one or more respective receivers adapted to receive the track signals transmitted via the rails of the track 3, 5. In an embodiment, the railway vehicle 36 can only receive the track signals, if the railway vehicle 36 is on the respective track section 15, 17, 19, 21 via the track signal is transmitted, in front to it.

The presence of the railway vehicle 36 is detected via the electrical conduction of the axles of the railway vehicle 36. Thus, a signal transmitted via a first rail 7 is received on the second rail 9 and vice versa.

Further, FIG. 1 shows a faulty electric connection 38 between the second track section 17 of the first track 3 and the second track section 21 of the second track 5. Thus, if the controller 30, in particular a second transmitter 27 transmits the second track signal via the second track section 17 of the first track 3 it is also transmitted via the second track section 21 of the second track 5. Thus, the railway vehicle 36 may receive the second track signal not intended for it due to the faulty electric connection 38. Thus, there is the risk that the railway vehicle receives wrong speed information.

FIG. 2 shows an embodiment of a system according to the invention. The same features are designated with the same reference numbers as in FIG. 1. In FIG. 2 only one transmitting arrangement is shown, without the transmitter 26 in detail. However, for each other track section 17, 19 and 21 a further transmitting arrangement with the respective transmitters 27, 28, 29 may be provided. According to an embodiment, a first test and/or track signal is provided as a differential transmission signal on both rails 7, 9. For example, the controller 30 sends the first test and/or track signal.

As already discussed with the embodiment of FIG. 1, the receivers 35a to 35d associated to the track sections 15, 17, 19, 21 are connected to the second end 34 of the respective track sections 15, 17, 19 and 21. On other words, a respective receiver 35a to 35d is associated to each track section 15, 17, 19 and 21.

In an embodiment, a first received signal 40 is provided by the first receiver 35a associated to the first track section 15 of the first track 3 to the controller 30, a second received signal 42 is provided by the receiver 35b associated to the second track section 17 of the first track 3 to the controller 30, a third received signal 44 is provided by the receiver 35c associated to the first track section 19 of the second track 5 to the controller 30, and a fourth received signal 42 is provided by the receiver 35d associated to the second track section 21 of the second track 5 to the controller 30. Thus, the controller 30 is provided by each receiver 35a to 35d associated with the track sections 15, 17, 19, 21, at least the track sections which are adjacent to the first track section 15, with the respective received signals 40, 42, 44, 46.

According some embodiments, a respective controller for emitting a test signal and/or the track signal is associated to each track section. Thus each controller transmits and/or generates the test and/or track signals only for the track section 15, 17, 19, 21 to which the controller is associated. In such an embodiment, the one and more receivers 35a to 35d associated to each track section 15, 17, 19, 21 provide the received signals 40, 42, 44, 46 to each of the controllers.

In another embodiment, the controller 30 generates and receives all test and/or track signals for each track section 15, 17, 19, 21. According to a further embodiment, one controller may be associated to several track sections but not all track sections.

As described here-above, the controller 30 is adapted to emit the first track signal and a first test signal 39 and to receive signals 40, 42, 44, 46. The received signals 40, 42, 44, 46 may include the first track signal and/or the first test signal.

FIG. 3 shows an embodiment of a test signal 50. The test signal 50 includes a signature 52, including for example between 4 and 20 bits, in particular between 6 and 12 bits. In FIG. 3, the signature includes 8 bits. According to an embodiment, which may be combined with other embodiments disclosed herein, the test signal 50 provided for each track section 15, 17, 19, 21 has a different signature. In other words, the at least one transmitter 26, 27, 28, 29 associated to one track section is adapted to send a test signal which is different to the test signal transmitted by a transmitter 26, 27, 28, 29 associated to another track section 15, 17, 19, 21. In other words, the one or more controllers 30 provide a different signature 52 for each track section 15, 17, 19, 21.

Thus, the one or more controllers 30 is adapted to determine, in particular by analyzing the signature 52 of a received test signal 50, by which transmitter 26, 27, 28, 29 or via which track section 15, 17, 19, 21 the test signal 50 was transmitted. For example, the at least one controller 30 may use a Boolean logic to determine whether there is a leakage and may also determine the path of the leakage.

For example, if the test signal 50 transmitted by the at least one transmitter 26, 27, 28, 29 associated to a specific track section 15, 17, 19, 21 is only received by the at least one receiver 35a to 35d associated to the same track section 15, 17, 19, 21 there is no leakage to another track section. However, in case the test signal transmitted by a transmitter associated to a specific track section 15, 17, 19, 21 is received by the receiver associated to another track section 15, 17, 19, 21, there is a leakage. In an embodiment, the controller 30 provides the first test signal 39 to be sent via the first track section 15 of the first track 3. Then, the controller receives the receive signals 40 and 44 both including the first test signal 39, which can be for example determined by the signature 52. Thus, as the receive signal 44 includes the first test signal was received by the at least one receiver 35c associated to the first track section 19 of the second track, the controller can determine that there is a faulty electric connection 38 or leakage between the first track sections 15, 19 of the first and second track 3, 5.

According to a further embodiment, which may be combined with other embodiments disclosed herein, only at least one transmitter 26, 27, 28, 29 associated to one track section 15, 17, 19, 21 for transmitting the test signal is active at a time. In other words, each test signal is transmitted at a specific time slot by the at least one transmitter 26, 27, 28, 29 associated to a respective track section 15, 17, 19, 21. For example a controller, for example the controller 30, may coordinate the transmission of the test signals 39, 50.

In some embodiments, the controller is adapted to transmit and/or generate the test signal 39, 50 only, when no railway vehicle 36 is present on the respective track section 15, 17, 19, 21. According to another embodiment, the received test signal is only evaluated, if the received track signal indicates that no railway vehicle is present on the track section. In some embodiments, the test signal is only emitted if the received track signal indicates that no railway vehicle 36 is present on the track section.

In an embodiment, the controller 30 may be associated to an interlocking.

According to an embodiment, the signature 52 is modulated using a frequency shift keying (FSK). The carrier frequency is between 200 Hz and 800 Hz, in particular between 400 Hz and 600 Hz. For example, the signature is modulated with 500 Hz.

According to an embodiment, which may be combined with other embodiments disclosed herein, the test signal 50 is added or modulated on the track signal.

For example, a modulation frequency of the track signal is between 20 Hz and 100 Hz, in particular between 30 Hz and 70 Hz.

For example, the track signal is a signal is modulated with a main carrier frequency of 50 Hz and code rates between 1.25 Hz and 4 Hz. Another embodiment may include a secondary frequency carrier at 178 Hz with codes rates between 1.25 Hz and 7 Hz. FIG. 4 shows a signal 54 transmitted by the transmitter associated to one track section 15, 17, 19, 21 and a received signal 56 received by a receiver associated to the same track section. As it can be seen, the received signal 56 has been attenuated by the rails of the track. The signal 54 includes the track signal and the test signal.

For example, during the time periods 58 the test signal is emitted and during time periods 60 the track signal is emitted. Thus, at some time periods the track signal and the test signal are sent concurrently, at some time periods they are overlapping and at some time periods they are sent one after the other. In other words, the test signal and the track signal are emitted independently from each other by the respective controller 30 and/or transmitter 26, 27, 28, 29.

Figure 5:
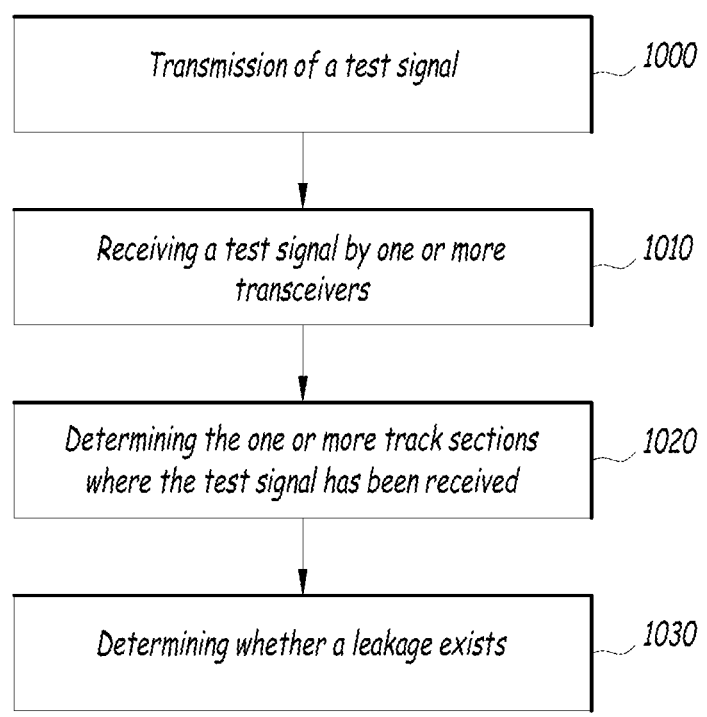
FIG. 5 shows schematically different steps of a method according to the invention.

FIG. 5 shows a flow chart of a method according to an embodiment. In a first step 1000, the controller 30 is adapted to transmit the test signal 50, for example by using the at least one first transmitter 26, via the first track section 15. For example, the test signal 50 has a signature specific for the first track section 15.

In a second step 1010, the test signal 50 is received by one or more receivers 35a to 35d associated to the same, first track section 15 and/or to other track sections 17, 19, 21.

In step 1020, the controller 30 determines the one or more track sections 15, 17, 19, 21 where the test signal has been received. In other words, which received signals 40, 42, 44, 46 have been received.

Then, in step 1030, the controller determines whether a leakage between a first track section 15 of the first track 3 and at least one second track section exists. For example, if no one of the receivers 35b to 35d associated to other track sections receives the test signal, the controller determines that there is no leakage between the track sections.

However, if one or more of the other receivers 35*b* to 35*d* receives the test signal, the controller determines that there is a leakage. For example, in case of FIG. 2, the receiver 35*c* receives the test signal and transmits the received signal 44 to the controller 30. Thus, the controller 30 could determine that there is a leakage 38 between the first track section 15 of the first track 3 and the first track section 19 of the second track 5.

If a leakage is identified, the transmission of a track signal including the speed code is blocked. Thus, a safety hazard is avoided.

According to some embodiments, the after the transmission of the test signal via the first track section is completed, the controller 30 transmits a further test signal, for example with another signature, via a second transmitter 27 for determining whether a leakage exists between the second track section 17 of the first track 3 and another track section 15, 19, 21.

According to embodiments disclosed herein, the same controller 30 may provide the signals for the track signal and the test signal. Thus, existing equipment for the track signal may be used.

The system and the method according to the invention provide a reliable solution to detect a track signal leakage, which is insensitive to noise.

The invention claimed is:

1. A method for detecting a leakage of a track signal on two railway tracks, the track signal being a signal transmitted via the rails of the railway tracks to detect the presence of a railway vehicle and/or to transmit information to a railway vehicle, each railway track comprising at least two adjacent track sections being electrically isolated against each other, wherein at least two adjacent track sections are on railway tracks which are located side by side with a length of a first track section extending alongside and adjacent of a length of a second track section, wherein at least one receiver is associated to each track section, the method comprising: transmitting a test signal via the first track section, wherein a respective test signal is transmitted via each track section, wherein a time slot is associated to each track section, and wherein each test signal is transmitted via the respective track section at their respective time slot, wherein the test signal is transmitted and/or generated by a controller only when no railway vehicle is present on the respective track section, and wherein the same controller provides the signals for the track signal and the test signal, wherein the test signal includes a signature, wherein a respective test signal is transmitted via each track section, and wherein the test signals transmitted via different track sections each have a different signature; activating one or more receivers associated to the track sections, wherein the receivers are adapted to receive the test signal; receiving the test signal via one or more track sections; determining the one or more track sections, where the test signal has been received; and determining whether a leakage between the first track section and the second track section exists.

2. The method according to claim 1, wherein the test signal is injected on a first end of the first track section and received at the second end, being opposite to the first end, and wherein the first end of the first track section is adjacent a first end of the second track section, and the second end of the first track section is adjacent a second end of the second track section.

3. The method according to claim 1, wherein the test signal is coded.

4. The method according to claim 1, wherein the test signal is modulated.

5. The method according to claim 4, wherein a modulation frequency of the test signal is greater than a modulation frequency of the track signal.

6. The method according to claim 4, wherein a carrier frequency of the test signal is between 200 Hz and 800 Hz.

7. The method according to claim 1, wherein the test signal is added onto the track signal.

8. The method according to claim 1, wherein a carrier frequency of the track signal is between 20 Hz and 100 Hz.

9. The method according to claim 1, wherein the track signal includes a speed information for the railway vehicle.

10. A controller for detecting a track signal leakage of a track signal on two railway tracks, the track signal being a signal transmitted via the rails of the railway tracks to detect the presence of a railway vehicle and/or to transmit information to a railway vehicle, each railway track comprising at least two adjacent track sections being electrically isolated against each other, wherein at least two adjacent track sections are on railway tracks which are located side by side with a length of a first track section extending alongside and adjacent of a length of a second track section, wherein at least one receiver is associated to each track section, wherein the controller is adapted to: transmit a test signal via the first track section, wherein a respective test signal is transmitted via each track section, wherein a time slot is associated to each track section, wherein the each test signal is transmitted via the respective track section at their respective time slot, wherein the test signal is transmitted and/or generated by the controller only when no railway vehicle is present on the respective track section, and wherein the same controller provides the signals for the track signal and the test signal, wherein the test signal includes a signature, wherein a respective test signal is transmitted via each track section, and wherein the test signals transmitted via different track sections each have a different signature; activate one or more receivers associated to the track sections, wherein the receivers are adapted to receive the test signal; receive the test signal via one or more track sections; determine the one or more sections, where the test signal has been received; and determine whether a leakage between the first track section and the second track section exists.

11. The controller according to claim 10, wherein the controller is adapted to transmit the track signal.

12. The controller according to claim 10, wherein the controller is adapted to modulate the test signal and the track signal.

13. A system for detecting a track signal leakage of a track signal on two railway tracks, the track signal being a signal transmitted via the rails of the railway tracks to detect the presence of a railway vehicle and/or transmit a provide information to a railway vehicle, each railway track comprising at least two adjacent track sections being isolated against each other, the system comprising: a controller for detecting the track signal leakage of the track signal on the railway tracks, the track signal being a signal transmitted via the rails of the railway tracks to detect the presence of a railway vehicle and/or to transmit information to a railway vehicle, each railway track comprising at least two adjacent track sections being electrically isolated against each other, wherein at least two adjacent track sections are on railway tracks which are located side by side with a length of a first track section extending alongside and adjacent of a length of a second track section, wherein at least one receiver is associated to each track section, wherein the controller is adapted to: transmit a test signal via the first track section, wherein a respective test signal is transmitted via each track section, wherein a time slot is associated to each track section, wherein each test signal is transmitted via the respective track section at their respective time slot, wherein the test signal is transmitted and/or generated by the controller only when no railway vehicle is present on the respective track section, and wherein the same controller provides the signals for the track signal and the test signal, wherein the test signal includes a signature, wherein a respective test signal is transmitted via each track section, and wherein the test signals transmitted via different track sections each have a different signature; activate one or more receivers associated to the track sections, wherein the receivers are adapted to receive the test signal; receive the test signal via one or more track sections; determine the one or more sections, where the test signal has been received; and determine whether a leakage between the first track section and the second track section exists; at least one transmitter for emitting a test signal via the first track section, the at least one transmitter being connected to the controller; and a plurality of receivers for receiving the test signal via one or more track sections, wherein each receiver is associated to at least one track section.

14. The system according to claim 13, wherein the at least one transmitter is provided at a first end of the first track section and at least one receiver is provided at a second end of the first track section being opposite to the first end, wherein further receivers are provided and connected to the other track sections, and wherein the first end of the first track section is adjacent a first end of the second track section, and the second end of the first track section is adjacent a second end of the second track section.

* * * * *